United States Patent [19]
Otsubo et al.

[11] Patent Number: 5,531,862
[45] Date of Patent: Jul. 2, 1996

[54] METHOD OF AND APPARATUS FOR REMOVING FOREIGN PARTICLES

[75] Inventors: Toru Otsubo, Fujisawa; Yasumichi Suzuki; Shinji Sasaki, both of Yokohama; Kazuhiro Ohara, Kudamatsu; Ichirou Sasaki, Yokohama, all of Japan

[73] Assignee: Hitachi, Ltd., Tokyo, Japan

[21] Appl. No.: 277,017

[22] Filed: Jul. 19, 1994

[30]       Foreign Application Priority Data

Jul. 19, 1993  [JP]  Japan .................................. 5-178067

[51] Int. Cl.⁶ .................................................. H01L 21/00
[52] U.S. Cl. ......................................................... 156/643.1
[58] Field of Search ................... 437/9, 225; 156/643.1, 156/345 P; 134/1, 1.1, 1.2, 1.3

[56]            References Cited

U.S. PATENT DOCUMENTS

| | | | |
|---|---|---|---|
| 5,247,954 | 9/1993 | Grant et al. ................................ | 134/1 |
| 5,377,709 | 1/1995 | Shibano ..................................... | 134/1 |

FOREIGN PATENT DOCUMENTS

| | | |
|---|---|---|
| 3-147317 | 6/1991 | Japan . |
| 3-153885 | 7/1991 | Japan . |
| 5-047712 | 2/1993 | Japan . |

OTHER PUBLICATIONS

Goree et al., "Particulate Release From Surfaces Exposed to Plasma", J. Vac. Sci. Technol. A10(6), Nov./Dec. 1992, pp. 3540–3544.

Primary Examiner—William Powell
Attorney, Agent, or Firm—Antonelli, Terry, Stout & Kraus

[57]           ABSTRACT

A method of and apparatus removes foreign particles in a vacuum or in a dry atmosphere before and in continuation to performing a dry process, such as a dry etching or a sputtering process. For this purpose, the foreign particles are separated from a substrate by subjecting the foreign particles to a force for separating the foreign particles from the substrate and a vibrating force for vibrating the foreign particles at the same time, and then the frequency of vibration is changed to match the resonant frequency of a vibration system formed by each of the foreign particles and the substrate, thereby applying a vibration energy to the foreign particles due to resonance. The separated foreign particles floating in a plasma are drawn to an electrode having a potential which is controlled such that a flowing-in of electrons is reduced, and the particles are discharged from the inside of the plasma. In this way, the foreign particles can be reduced and the yield of the product in manufacturing semiconductors and TFTs can be promoted. Further, a cleaning step, a film forming operation, an etching process and the like can continuously be processed, thereby achieving a reduction in steps and a promotion in productivity.

23 Claims, 8 Drawing Sheets

$F_1$ : VAN DER WAEL'S FORCE $F_2$ : REPULSION FORCE BY ELASTIC DEFORMATION OF BODY

METHOD OF AND APPARATUS FOR REMOVING FOREIGN PARTICLES

BACKGROUND OF THE INVENTION

This invention relates to dry processing, such as dry etching, sputtering, chemical vapor deposition (CVD) or the like, which forms a fine pattern of a semiconductor element or a liquid crystal display element, and more particularly to method of and apparatus for removing foreign particles adhering to a substrate and for cleaning the inside of the apparatus.

Further, this invention relates to a method of an apparatus for cleaning and removing foreign particles from a substrate and cleaning the apparatus in producing elements.

In the production of a semiconductor element or a liquid crystal display element, the element is formed with a fine pattern. Therefore, in forming films, a defect is created on these fine patterns by foreign particles which adhere thereto during an etching process. Due to such defects, a portion of a semiconductor element or a liquid crystal display element will not function and a failure occurs which gives rise to a lowering of the yield.

At present, the source of generating foreign particles is mainly the dry processing device per se, such as a device for dry etching or sputtering, and the reduction in the dust generation by such device per se is a major problem. Further, as for foreign particles which adhere to the substrate, the foreign particles are removed by a wet cleaning process arranged between respective processing steps, thereby preventing defects from being produced. However, in the production of a semiconductor element or a liquid crystal element, there is a desire to enhance the productivity by making the respective processing steps continuous, and therefore, the application of the conventional wet cleaning process becomes difficult. Accordingly, the removing of foreign particles which adhere to a substrate during the dry process steps is an important problem.

A method has been disclosed in Japanese Laid Open Patent publication No. 14713/1991 for reducing dust generation by the processing device per se, wherein foreign particles are prevented from adhering to a substrate by effecting a discharge of the foreign particles flowing in a plasma.

Methods of removing foreign particles which have adhered to a substrate in a dry atmosphere have been disclosed in Japanese Laid Open Patent Publication No. 208217/1988 and Japanese Laid Open Patent Publication No. 1237/1989, wherein, with respect to electrified foreign particles, the foreign particles are separated from the surface of the substrate to which the foreign particles adhere, by blowing an ionized gas, removing the electrification and applying a vibration thereto and the like.

Among the methods of removing foreign particles floating in a plasma, which have been disclosed in the above mentioned publications, it is possible that the foreign particles generated during the plasma processing will not adhere to the substrate. However, foreign particles which have already adhered to the substrate before the plasma processing remain as they were, which is a cause of defects. As is disclosed in the above conventional technique, the foreign particles, which have been generated during the plasma processing, float on a sheath of plasma above the substrate and adhere onto the substrate when the plasma is cut off after the processing is complete. Accordingly, the defects generated in the plasma processing are due to foreign particles which have adhered to the substrate before the plasma processing, and it is a problem in preventing the generation of defects by foreign particles to remove the foreign particles which have adhered to the substrate before the plasma processing.

In these conventional techniques for removing foreign particles that adhere to the substrate in a dry atmosphere, a major adsorbing force for causing the foreign particles to adhere to the substrate is regarded as an electrostatic force produced by electrification. However, an adsorbing force due to van der Waal's force represents a large proportion of the adhering force which produced this problem, and therefore, it is not possible to separate the foreign particles from the substrate simply by removing the electrification. It is a problem in certainly removing the foreign particles to separate the foreign particles from the substrate by overcoming this van der Waal's force.

SUMMARY OF THE INVENTION

It is an object of the present invention to provide a method of an apparatus for removing foreign particles which can certainly remove foreign particles on a substrate in a vacuum chamber and in a dry gas atmosphere as in a dry processing.

According to an aspect of the present invention, there is provided an apparatus for removing foreign particles which removes foreign particles adhering to a surface of a processed substrate, said apparatus comprising:

separating force applying means for applying a separating force to the foreign particles in a direction of separating the foreign particles from the processed substrate;

vibrating means for applying a vibrating force to the foreign particles; and vibration frequency variable means for varying a frequency or separating force produced by the vibrating means, whereby the vibrating force is varied.

According to another aspect of the present invention, there is provided an apparatus for removing foreign particles according to the first aspect, further comprising:

foreign particle discharging means for discharging foreign particles which have been separated from the surface of a processed substrate by the separating force applying means, the vibrating means and the vibration frequency variable means to outside of a region of the processed substrate.

According to another aspect of the present invention, there is provided an apparatus for removing foreign particles which removes foreign particles adhering to a surface of a processed substrate in a processing chamber having at an inside thereof a mounting means for mounting the processed substrate, said apparatus comprising:

plasma generating means for generating a plasma at the inside of the processing chamber;

direct current voltage applying means for applying a direct current voltage on the mounting means mounted with the processed substrate; and high-frequency voltage applying means for applying a frequency variable high-frequency voltage on the mounting means mounted with the processed substrate.

According to another aspect of the present invention, there is provided an apparatus for removing foreign particles according to the preceding aspect, further comprising:

second direct current applying means for applying a second direct current voltage on a wall face of the processing chamber; and second high-frequency voltage applying means for applying a second frequency variable high-frequency voltage on the wall face of the processing chamber.

According to another aspect of the present invention, there is provided an apparatus for removing foreign particles adhering to a surface of a processed substrate in a processing chamber having at an inside thereof a mounting means for mounting the processed substrate, said apparatus comprising:

plasma generating means for generating a plasma at the inside of the processing chamber;

direct current voltage applying means for applying a direct current voltage on a wall face of the processing chamber; and high-frequency voltage applying means for applying a frequency variable high-frequency voltage on the wall face of the processing chamber.

According to another aspect of the present invention, there is provided an apparatus for removing foreign particles according to the preceding aspect, further comprising:

electrode means including an anode communicating with plasma at the inside of the processing chamber by connecting to a direct current power supply and capable of controlling a flowing-in of electrons from the plasma to the anode by the direct current power supply.

According to another aspect of the present invention, there is provided a method of removing foreign particles comprising the steps of:

resonating foreign particles adhering to a surface of a processed substrate by applying a varying external force on the foreign particles; and discharging the foreign particles which have been separated from the processed substrate by the external force to outside of a region of the processed substrate, whereby the foreign particles are removed from the processed substrate.

According to another aspect of the present invention, there is provided a method of removing foreign particles comprising the steps of:

generating a plasma in a vicinity of a surface of a processed substrate disposed in a vacuum vessel;

resonating foreign particles adhering to the surface of the processed substrate by varying an electric field between the plasma and the surface of the processed substrate; and discharging the foreign particles to an outside of a region of the processed substrate by drawing the foreign particles which have been separated from the surface of the processed substrate by the resonating to an electrode disposed at the outside of the region of the processed substrate, whereby the foreign particles are removed.

In this invention, there are provided means for electrifying foreign particles adhering to a surface of a substrate by generating a plasma, an electron shower, or an ionized gas and for generating a force for separating the foreign particles from the substrate using an electric field, means for applying a high-frequency varying force on the foreign particles, and means for setting a plurality of frequencies and the like of the separating force and the varying force, in a vacuum processing chamber and in a dry gas atmosphere.

Further, in case of electrifying the foreign particles by generating a plasma, electrodes are provided in a processing chamber which are connected to a direct current power supply and are in communication with the plasma, and a means is employed in its anode for restricting flowing-in of electrons, thereby adsorbing and removing the foreign particles. In case of electrifying the foreign particles by an electron shower or by an ionized gas, a counter electrode is provided which generates an electric field, by which the foreign particles are adsorbed to it and are removed.

Figure 9:
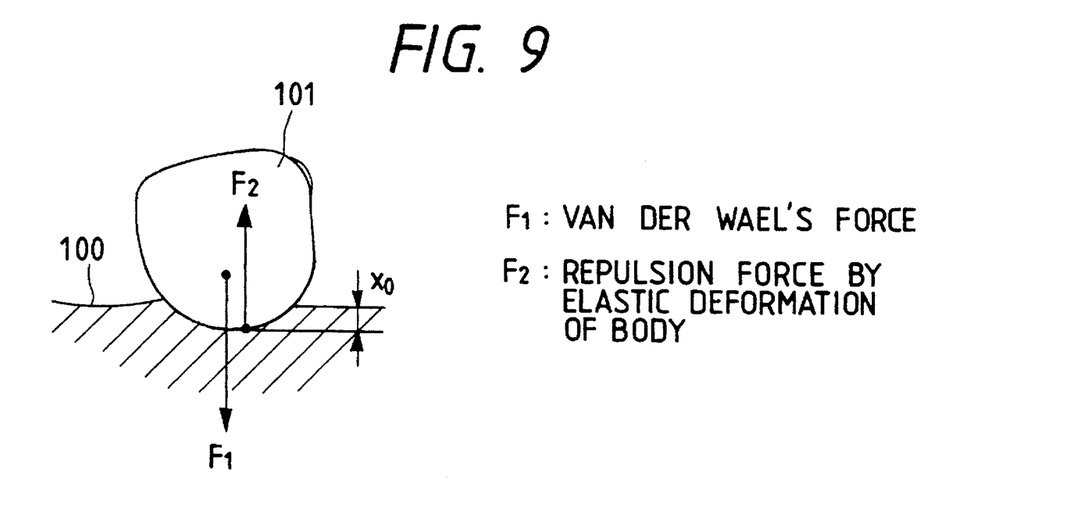
FIG. 9 is a diagram partly in section showing a model of a vibration system of adhered foreign particles according to the present invention.

The surface of the substrate exposed to a plasma, electrons, or an ionized gas and the foreign particles adhering to the surface of the substrate are electrified. The van der Waal's force between the foreign particles and the surface of the substrate, an electric repulsion force by an electrified charge, a force generated by an electric field and electrified foreign particles, a force generated by an elastic deformation between the surface of the substrate and the foreign particles, and the like are applied to the foreign particles. As shown in a model in FIG. 9, wherein a foreign particle 101 adheres to a surface 100 of a body, in a state in which the foreign particle 101 enters the side of the body from a position $x_0$ in which the foreign particle 101 stably adheres to the surface 100 of the body, a repulsion force $F_2$ from the side of the body is larger than the van der Waal's force $F_1$, whereas, in a state wherein the foreign particle is apart in a direction of separating from the side of the body with respect to the position $x_0$, the van der Waal's force $F_1$ is larger than the repulsion force $F_2$ exerted from the side of the body. Accordingly, it is understood that a vibration system is formed by the foreign particle 100, centering on the stable position $x_0$.

The van der Waal's force $F_1$ is inversely proportional to the square of the distance between the particle (foreign particle) and the surface of the body (substrate). Therefore, the force is considerably reduced when the particle is a little separated from the surface of the body. Therefore, when a vibration having a frequency which is near to a resonant frequency which is based on the natural frequency of the vibration system is exerted on the foreign particles, each forming a vibration system, as an external force, the amplitude of vibration of each particle gradually increases and the van der Waal's force operating between the particle and the surface of the body decreases, and therefore, the particle can be separated from the surface of the body by a smaller force.

Therefore, it is necessary for efficiently removing the foreign particles adhering to the surface of the substrate from the surface of the substrate, not only to apply an external force which vibrates in coincidence with the resonant frequency of each of the foreign particles which have adsorbed to the surface of the substrate, but to apply a force thereon for separating the foreign particles from the surface of an substrate. When the external force varying in the frequency near to the resonant frequency of the vibration system is applied on each particle, while applying a separating force to each particle, the vibration of each of the foreign particles gradually increases, finally overcoming the van der Waal's force, whereby the foreign particles are separated from the substrate.

As for the situation of the adsorbed foreign particles, there are differences in the size of the foreign particle, its electrification state, the situation of the surface of the substrate and the like, and there are differences among the formed vibration systems with respect to the resonant thereof. Therefore, the frequency of the applied varying force is changed and a frequency in conformity with the situation of the respective foreign particle is applied on each particle, whereby the adsorbed foreign particles can efficiently be removed.

In case of electrifying the foreign particles by generating a plasma, since the speed of movement of the electrons is fast, the removed foreign particles are negatively electrified and they float in a boundary region of the plasma above the sheath by an electric field of the sheath. Although electrons having a fast speed movement flow to an anode, it is possible to draw the negatively electrified foreign particles and the like and remove them from the plasma, by restricting a flowing-in of electrons to the anode. Further, in case of not generating a plasma, since an electric field is generated by providing a counter electrode, the foreign particles are adsorbed onto the face of the counter electrode by the electric field and are removed.

A similar operation can be achieved by changing a force for separating the foreign particles by which the resonant frequency of this vibration system can be changed, instead of changing the frequency of the varying force as above.

According to this invention, it is possible to remove any foreign particles which adhere to a substrate, such as a wafer, that is an object of an etching or a film forming operation, inner wall faces of a processing chamber, or an object in the processing chamber, such as a target for film forming. It is possible to create a state wherein the substrate does not have foreign particles adhering thereto and a state wherein the separated foreign particles do not adhere thereto again, can be attained. It is possible to perform an etching or a film forming following the foreign particle removing step in a state wherein such a foreign particle removing step has been performed, and it is possible to perform an exposure step following the removing of the foreign particles from the substrate and from the surface of an exposure stage even in a processing in an atmospheric environment, as in the exposure step, thereby reducing operational steps, achieving a promotion in the product yield in manufacturing semiconductor devices and promoting productivity.

DESCRIPTION OF THE PREFERRED EMBODIMENT

An explanation will be given of a first embodiment of this invention with reference to FIG. 1.

Figure 1:
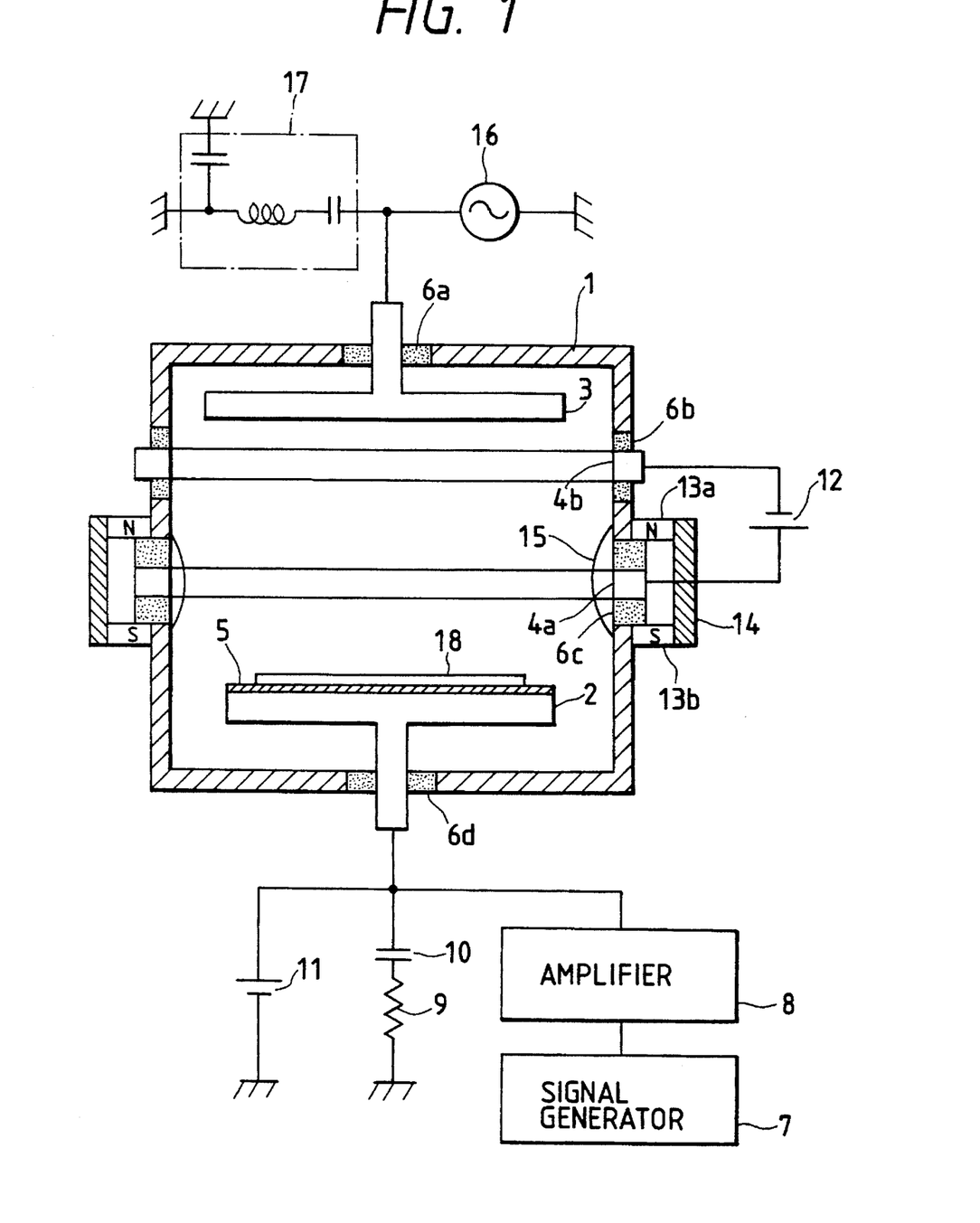
FIG. 1 is a diagram partly in section showing the construction of an apparatus for removing foreign particles which adhere to a wafer by employing a plasma according to the present invention.

FIG. 1 is a diagram showing an embodiment of a method of removing foreign particles and its apparatus according to the present invention, wherein numeral 1 designates a vacuum chamber, numeral 2 designates a stage, numeral 3 designates a counter electrode, numerals 4a and 4b designate electrodes for removing foreign particles, numeral 5 designates an insulating layer, numerals 6a, 6b, 6c and 6d designate insulating materials, numeral 7 designates a signal generator, numeral 8 designates an RF amplifier, numeral 9 designates a resistor, numeral 10 designates a capacitor, numerals 11 and 12 designate DC power supplies, numerals 13a and 13b designate magnets, numeral 14 designates a core, numeral 15 designates a magnetic field, numeral 16 designates an RF power supply for generating a plasma, numeral 17 designates a filter, and numeral 18 designates a wafer.

In FIG. 1, the stage 2 coated with the thin insulating layer 5 on its surface and the counter electrode 3 for generating a plasma are opposedly provided in the vacuum chamber 1, and a couple of electrodes 4a and 4b for removing foreign particles are provided between the stage 2 and the counter electrode 3. The wafer 18 for forming a fine pattern is mounted on the insulating film 5 of the stage 2. The vacuum chamber 1 can be supplied with a gas for a plasma processing from a supply source, not shown, and gases in the vacuum chamber 1 can be exhausted by a vacuum generating device, not shown.

The stage 2 is composed of an electrically conductive body, which is installed at the bottom face of the vacuum chamber 1 through the insulating material 6d. Also the counter electrode 3 is installed at the upper face of the vacuum chamber 1 through the insulating material 6a.

The stage 2 is respectively supplied with an RF voltage from the signal generator 7 through the RF amplifier 8 and a positive DC voltage from the DC power supply 11, and the frequency of the RF voltage generated from the signal generator 7 is continuously changed. The stage 2 is grounded through the capacitor 10 and the resistor 9, such that a matching of the high-frequency amplifier 8 and the load impedance of a plasma can be made also with respect to a change in frequency. Further, the insulating layer 5 on the stage 2 prevents an electric charge which flows in from the plasma, from flowing to ground and helps electrify the wafer 18 by a voltage applied from the DC power supply 11.

The counter electrode 3 is supplied with an RF voltage of 100 MHz from the RF power supply 16 for generating a plasma, a high-frequency current flows from the counter electrode 3 to among the inner walls of the vacuum chamber, and a plasma is generated. The filter 17 is connected to the counter electrode 3 so that the impedance between the counter electrode 3 and ground is low with respect to the frequency of the RF voltage applied to the stage 2. Thus, an RF current due to the RF voltage applied to the stage 2 uniformly flows to the counter electrode 3, and, since the impedance is high with respect to the frequency of RF current for generating the plasma, the RF current for generating the plasma does not flow to ground.

The electrode 4a for removing foreign particles is supplied with a positive voltage from the DC power supply 12 and the electrode 4b for removing foreign particles is applied with a negative voltage of the DC power supply 12. These electrodes 4a and 4b for removing foreign particles are attached to inner walls of the vacuum chamber 1 respectively through the insulating materials 6c and 6b. Magnetic field generating means composed of couples of magnets 13a and 13b, which surround the end portions of the electrode 4a for removing foreign particles, and the core 14, are provided at both end portions of the electrode 4a for removing foreign particles. Further, although the electrode 4a for removing foreign particles and the magnetic field generating means are disposed on the side of the stage 2, these elements may be disposed on the side of the counter electrode 3. In the following explanation, these electrodes 4a and 4b for removing foreign particles are disposed as illustrated.

Next, an explanation will be given of the operation of this embodiment.

The wafer 18 is mounted on the stage 2 and a constant amount of a gas is supplied to the vacuum chamber 1 from a gas supply source for plasma processing, not shown. If the gas is only for removing the foreign particles, an inert gas such as argon gas is used. The gas is exhausted by a vacuum generating device, not shown, the inside of the vacuum chamber 1 is maintained at a vacuum of approximately 1 Pa, and a plasma is generated in the vacuum chamber 1 by supplying a high-frequency power from the RF power supply 16 for generating a plasma at the counter electrode 3.

A positive DC voltage is applied on the stage 2 from the DC power supply 11, and a negative charge flows from the plasma, whereby the surface of the wafer is electrified and also the foreign particles adhering to the surface of the wafer are negatively electrified. The frequency of the RF voltage outputted from the signal generator 7 is continuously changed from 1 kHz to 50 MHz, amplified by the RF amplifier 8 and is applied to the stage 2.

A sheath (spatial charge layer) is formed between the plasma generated by the counter electrode 3 and the surface of the wafer 18, and a high-frequency electric field is generated at the sheath by the RF voltage applied on the stage 2. In this high-frequency electric field, a direct current electric field is synthesized in this high-frequency electric field which is caused by a difference in speeds of movement of electrons and ions, and the foreign particles on the wafer 18, which are negatively electrified by the electric field, are subject to a force for separating the foreign particles from the wafer, which force is strengthened or weakened by changes in the frequency of the high-frequency wave, and so the foreign particles are subject to a vibration by the changing force. It is considered that the foreign particles on the wafer 18 are drawn to the wafer by a force, such as van der Waal's force, and that a kind of vibration system is formed by the separating force, mentioned above. When the period of the varying force to separate each of the foreign particles, which is received by each of the foreign particles from the high-frequency electric field, is equal to the period of this vibration system, each of the foreign particles will considerably vibrate in a direction for separating it from the substrate, until the force finally surpasses the potential energy created by the van der Waal's force, thereby separating it from the surface of the wafer 18.

Further, as a method of applying a plurality of frequencies, there is a method of performing an AM modulation. In this method, the plurality of frequencies are the original frequency and the modulated frequency. Further, the same effect can be achieved by applying a radio wave which is FM-modulated.

Since the foreign particles has various sizes, the vibration systems formed by the foreign particles on the wafer 18 are respectively provided with different periods of vibration. Accordingly, the vibration energy is enhanced for each of the foreign particles having a different period of vibration by continuously changing the frequency of the RF voltage applied to the stage 2, or by applying a plurality of thereto, thereby separating it from the surface of the wafer 18. In this way, more foreign particles can be removed by changing the frequencies, and defects caused by the foreign particles on the surface of the wafer can be reduced. Further, the continuous changing of the RF voltage and the process of setting a plurality of frequencies may be performed once, they may be repeatedly performed for a plural number of times.

The foreign particles separated from the wafer 18 enter the plasma by being drawn to the electric field of the sheath. Since the electron temperature of the discharge plasma is considerably high compared with the ion temperature, the foreign particles in the plasma are negatively electrified such that the charge amounts incident on the surface of the foreign particles are equivalent. Also, with respect to a sheath formed between the plasma and the electrode or the inner wall of the vacuum chamber, an electric field is formed from the plasma in the direction toward the wall face based on the same principle. This electric field operates to reduce the flowing-away of electrons. Therefore, the negatively electrified foreign particles can not come out of the plasma due to this electric field, so they float in the vicinity of the sheath of the plasma.

A magnetic field is formed in parallel to the surface of the electrode 4a for removing foreign particles using the magnets 13a and 13b and the core 14, and electrons in the plasma are restrained by the magnetic field. Therefore, a flowing-in of electrons to the electrode 4a for removing foreign particles is considerably reduced. Further, an electric field is formed in the direction of drawing the negatively electrified foreign particles to the side of the electrode 4a for removing foreign particles, at the sheath on the surface of the electrode 4a for removing foreign particles by applying a positive voltage on the electrode 4a and a negative voltage on the electrode 4b for removing foreign particles, from the DC power supply 12. As a result, the foreign particles are adsorbed onto the electrode 4a by this electric field.

A very weak electric field is formed in the plasma by the DC voltage applied between the electrodes 4a and 4b for removing foreign particles, and the negatively electrified foreign particles in the plasma move toward the electrode 4a by this electric field, and are adsorbed as described above.

In this way, the foreign particles separated from the surface of the wafer 18 are adsorbed on the surface of the electrode 4a and do not adhere to the wafer 18 again.

It is possible to introduce a processing gas, such as an etching gas, a CVD gas or the like into the vacuum chamber 1, and to continuously perform a dry process such as an etching or a CVD, after removing the foreign particles. It is also possible to take out the wafer from the vacuum chamber 1 and to perform the processing in another chamber. Further, an explanation has been given to this embodiment centering on the removing of foreign particles by an inert gas. However, the removing process can be performed in combination with a processing, such as a dry etching process. The foreign particles are removed from the wafer using the same method as explained in this embodiment, by introducing an etching gas, and are taken in the plasma. Under this condition, the high-frequency bias condition applied on the stage 2 is equal to that in a normal etching process, and the etching is performed. A process having no influence of the foreign particles can be performed, since the foreign particles which have been taken in to the plasma are adsorbed to the electrode 4a for removing foreign particles and are removed.

Next, an explanation will be given of removing adsorbed foreign particles. The wafer is taken out from the vacuum chamber 1, a plasma is generated, the polarity of the DC power supply 12 is switched, a positive voltage is applied on the electrode 4a for removing foreign particles and a negative voltage is applied on the electrode 4b for removing foreign particles. Next, $O_2$, $CF_4$ and $Cl_2$ are successively introduced into the vacuum chamber 1 as cleaning gases, and ions and radicals of these are generated and are incident on the surface of the electrode 4a for removing foreign particles. Although the magnetic fields are formed on the surface of the electrode 4a for removing foreign particles as mentioned above, these ions and radicals receive almost no influence from the magnetic fields. The ions are accelerated by the electric field of the sheath formed on the surface of the electrode 4a and are incident thereon, and these ions react with the foreign particles adsorbed on the surface along with the radicals, gasify them, and the reacted gases are discharged from the vacuum chamber, thereby performing a cleaning.

The foreign particles which have adhered to the wafer 18 are removed and are discharged from the vacuum chamber 1 by the above continuous processing.

In this embodiment, not only the removing of the foreign particles on the surface of the wafer, but the removing of the foreign particles on the back face can be performed by turning over the wafer and mounting it on the stage 2. Further, when sulfur hexafluoride gas is used as a cleaning gas, even the foreign particles embedded in the wafer can readily be removed since the surface of the silicon wafer is isometrically etched by generated fluorine radicals, by which the prevention of contamination in a diffusing furnace or the like can be achieved.

In this embodiment, it is also possible to perform a method of changing the resonant frequency of the vibration system by changing the intensity of the separating force, as a method of matching the resonant frequency of the vibration system formed by the foreign particles adsorbed onto the substrate, with the varying frequency of the separating force. It is possible as a method of changing the intensity of the separating force, to change the electrified charge on the foreign particles and change the separating force by changing the applied DC voltage from the DC power supply 11.

Figure 2:
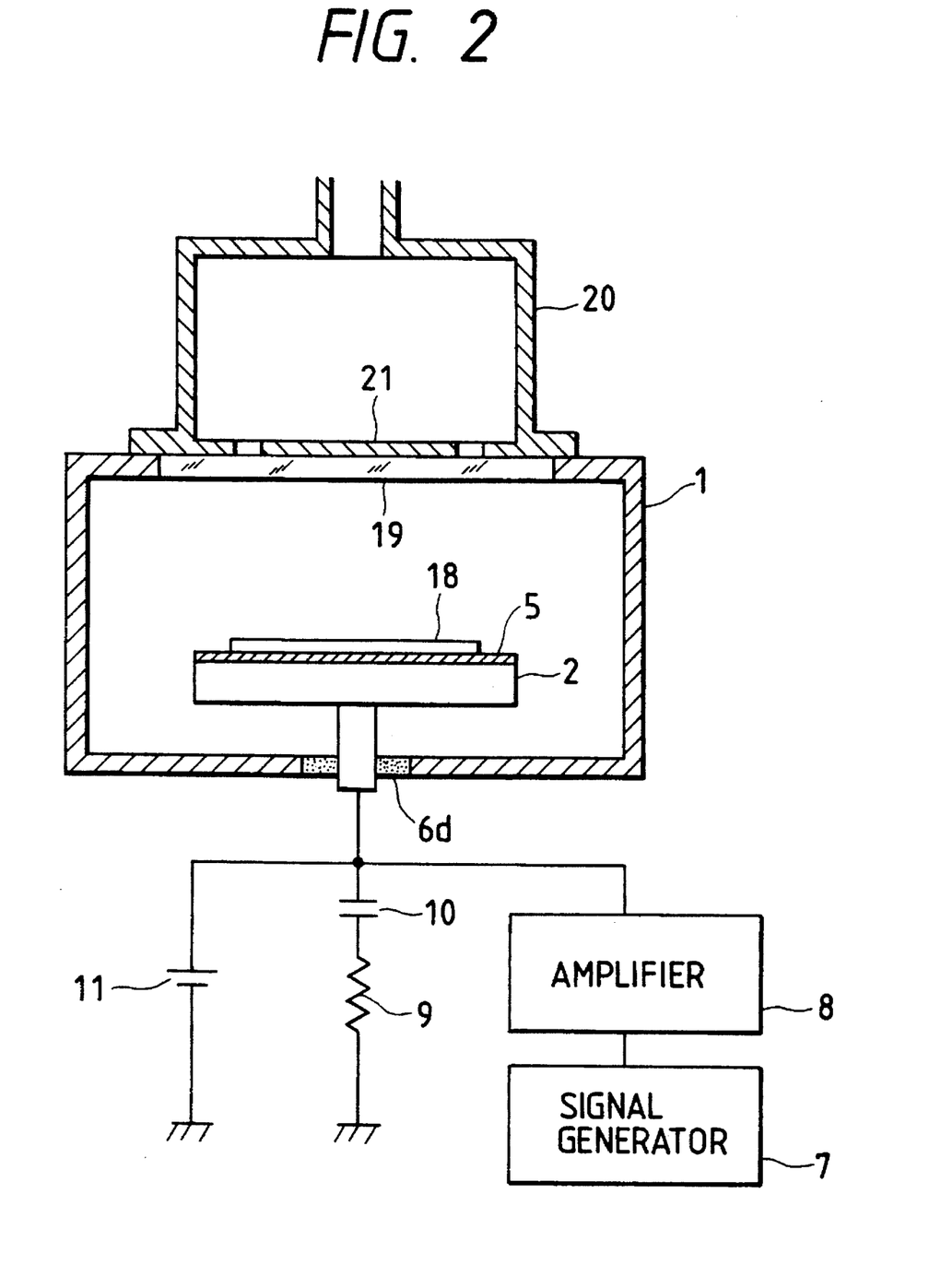
FIG. 2 is a diagram partly in section showing the construction of an etching apparatus wherein foreign particles adhering to a wafer are removed before an etching process by applying this invention to the etching device.

FIG. 2 is a diagram showing another embodiment of a method of removing foreign particles and its apparatus according to the present invention, wherein numeral 19 designates a quartz window, numeral 20 designates a cavity resonator, and numeral 21 designates a slot antenna. The elements corresponding to those in FIG. 1 are given the same notation and a duplicate explanation thereof will be omitted.

In FIG. 2, in this embodiment, the cavity resonator 20 is provided instead of the counter electrode 3 in the embodiment shown in FIG. 1.

The quartz window 19 is installed on a wall face of the vacuum chamber 1 opposing the stage 2, and the cavity resonator 20 having the slot antenna 21 is installed in juxtaposition with the quartz window, such that the slot antenna 21 is directed to the quartz window 19.

As in the embodiment shown in FIG. 1, a plasma processing gas is introduced into the vacuum chamber 1, a vacuum state of approximately 1 Pa is maintained, and the stage 2 is supplied with an RF voltage, at a frequency which continuously changes, from signal generator 7 via the RF amplifier 8, and a positive DC voltage from the DC power supply 11. Further, a microwave is supplied to the cavity resonator 20 from a microwave supply source, not shown. The quartz window 19 maintains a vacuum in the vacuum chamber 1 and the microwave can be radiated from the slot antenna 21 to the vacuum chamber 1.

Next, an explanation will be given of the operation of this embodiment.

An aluminum layer is formed on the surface of the wafer 18 which is mounted on the stage 2, on which a resist mask is formed. For instance, an etching gas ($Cl_2$) is introduced into the vacuum chamber, which is exhausted by a vacuum generating device, not shown, thereby maintaining the inside of the vacuum chamber 1 at a vacuum of approximately 1 Pa. Next, a microwave is supplied to the cavity resonator 20, which is radiated to the inside of the vacuum chamber 1 by the slot antenna 21, thereby generating a plasma. The cavity resonator 20 has the function of matching the load of the plasma generated in the vacuum chamber 1 with the microwave, by which the plasma is stabilized.

In addition thereto, a positive DC voltage is supplied to the stage 2 from the DC power supply 11, a negative charge is made to flow from the plasma, and the surface of the wafer 18 is negatively electrified. Therefore, the foreign particles adhering to the surface of the wafer 18 are also negatively electrified. Further, an RF voltage having a frequency which continuously changes, is applied on the stage 2 as in the embodiment shown in FIG. 1, from the signal generator 7 through the RF amplifier 8.

As in the embodiment shown in FIG. 1, a sheath is formed between the plasma and the surface of the wafer 18, and a high-frequency electric field whose frequency changes in accordance with the frequency of the RF voltage, is generated at the sheath by the RF voltage applied to the stage 2. A force for separating the foreign particles from the wafer 18 is applied thereto by the operation of the high-frequency electric field and the electric charge of the foreign particles. When the frequency of the high-frequency electric field agrees with the natural frequency of each of the adhered foreign particles, each of the foreign particles is separated from the wafer 18. The separated foreign particles float in the plasma on the sheath.

Under this state, when the frequency of the RF voltage of the signal generator 7 is set as 13.56 MHz, and the output of the RF amplifier 8 is set at 100 W by which an etching is performed. During this processing, the foreign particles are maintained in the above state, and do not adhere to the wafer 18. In this way, a failure of etching such as shortcircuiting of an etching, pattern by the foreign particles, can be reduced.

After the above processing, the supply of the microwave is stopped, and the etching gas is exhausted. At this moment, the foreign particles floating in the plasma adhere to the surface of the wafer 18 again, with the disappearance of the plasma due to the stoppage of supplying the microwave. However, a pattern has already been formed on the surface. The foreign particles can be removed by a cleaning or the like of the wafer 18 without a negative influence on the pattern.

Next, an explanation will be given of another embodiment of a method of removing foreign particles and its apparatus in performing a sputtering according to the present invention with reference to FIG. 3. Numeral 22 designates a target electrode, numeral 23 designates a target, numerals 24 and 25 designate coils, numeral 26 designates a yoke, numeral 27 designates a sputtering power supply, numeral 28 designates a coil power supply, numeral 29 designates a magnetic field, numerals 30, 31, 32 and 33 designate switches and numeral 34 designates an RF power supply. The elements corresponding to those in FIG. 1 are given the same notation and a duplicated explanation will be omitted.

Figure 3:
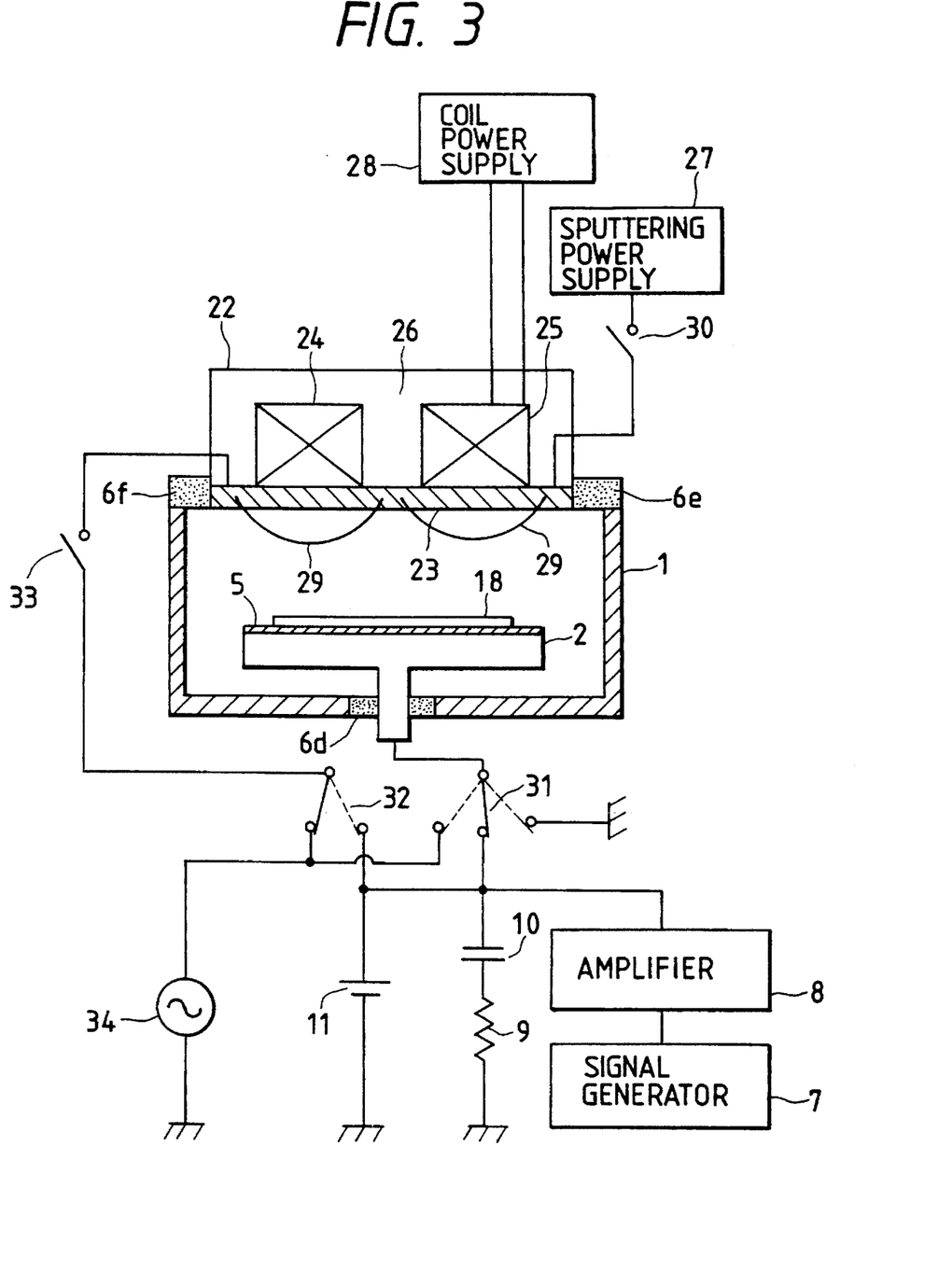
FIG. 3 is a diagram partly in section showing an embodiment wherein this invention is applied to a sputtering apparatus.

The target electrode 22 composed of the target 23, the coils 24 and 25 and the yoke 26 is installed at an opening of the vacuum chamber opposite to the stage 2, in FIG. 3. The target electrode 22 is insulated from the wall face of the vacuum chamber 1 through the insulating materials 6e and 6f. The coils 24 and 25 are connected to the coil power supply 28. The sputtering power supply 7 is connected to the target electrode 22 through the switch 30. Further, the switch 31 selects either one of connecting three states including (a) connecting the stage 2 to ground, (b) connecting the stage 2 to the RF amplifier 8, the capacitor 10 and the DC power supply 11, and (c) connecting the stage 2 to the RF power supply 34, which is itself connectable to the target electrode 22 through the switch 33.

First, a cleaning gas is introduced into the processing chamber 1, and RF power is supplied to the stage 2 from the RF power supply 34 through the switch 31 by which a plasma is generated. At this moment, the switch 30 is turned off open and the coil power supply 28 is not operated.

Under this state, the switch 33 is turned on closed, and an RF voltage, which is outputted from the RF amplifier 8 through the switch 32 and at a frequency which continuously changes, and a DC voltage, from the DC power supply 11, are supplied to the target electrode 22. An electric field having a frequency in accordance with the change of the frequency of the RF voltage from the RF amplifier 8 is generated at the sheath between the plasma and the surface of the target 23. By this means, the foreign particles, which have adhered to the surface of the target 23, and films apt to be stripped off are removed by the same operation as in the preceding embodiment, and the detached foreign particles float in the plasma.

Further, the RF voltage of the RF power supply 34 is applied to the target electrode 22 by the switches 32 and 33 thereby generating a plasma, and the RF voltage which is outputted from the RF amplifier 8 by the switch 31 and which has a frequency which continuously changes, and the DC voltage of the DC power supply 11, are applied to the stage 2, by which the foreign particles on the wafer 18 can be removed by the same operation as in the preceding embodiment.

Also in this embodiment, as in the embodiment shown in FIG. 1, the foreign particles floating in the plasma can naturally be removed by the electrodes for removing the foreign particles and the magnetic field generating means. After the foreign particles on the surface of the target 23 and the foreign particles on the surface of the wafer 18 have been removed as described above, the switch 33 is turned off opened, and the stage 2 is connected to ground by the switch 31. Current flows from the coil power supply 28 to the coils 24 and 25, a magnetic field is generated on the surface of the target electrode 22, the switch 30 is placed in a connecting state, power is supplied from the sputtering power supply 27 to the target electrode, and a sputtering is performed.

In this way, the foreign particles on the wafer 18 and target 23 are removed, and the film forming can be performed without being negatively influenced by the foreign particles.

Figure 4:
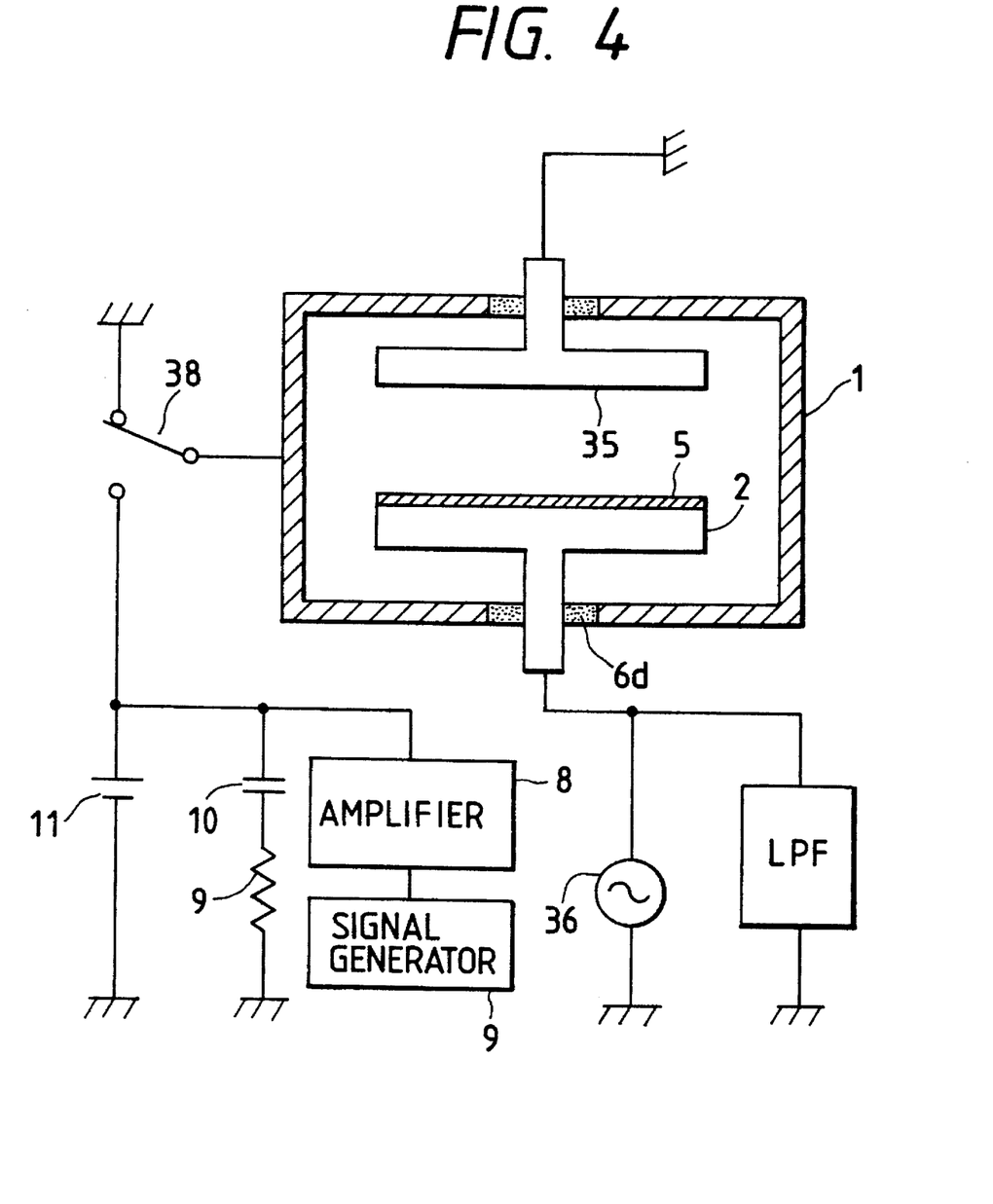
FIG. 4 is a diagram partly in section showing the construction of an apparatus for removing foreign particles on inner faces of a processing chamber.

FIG. 4 is a diagram showing another embodiment of a method of removing foreign particles and its apparatus according to the present invention, wherein numeral 35 designates a ground electrode, numeral 36 designates an RF power supply, numeral 37 designates an LFP (low pass filter), and numeral 38 designates a switch. The elements corresponding to those in FIG. 1 are given the same notation and a duplicate explanation thereof will be omitted.

This embodiment is for removing foreign particles or layers apt to be stripped off which adhere to the inner wall face of the vacuum chamber 1 in a wafer processing, such as an etching or a CVD processing. In FIG. 4, the RF power supply 36 and the LFP 37 are connected to the stage 2. Further, the ground electrode 35 is attached to the vacuum chamber 1 opposite to the stage 2 such that the ground electrode is insulated from the inner wall of the vacuum chamber. The switch 38 selects between a state of grounding the vacuum chamber 1 and a state of connecting the vacuum chamber 1 to the RF amplifier 8, the capacitor 10 and the DC power supply 11.

Next, an explanation will be given of the operation of this embodiment.

Normally argon gas or the like is employed for cleaning. When the layer attached with foreign particles is a silicon oxide layer, it is possible to use a gas for etching the adhered layer such as ethylene fluoride gas, which can be used along with an etching gas. After a cleaning gas has been introduced into the vacuum chamber 1, when an RF voltage is applied from the RF power supply 36 to the stage 2, a plasma is generated between the stage 2 and the ground electrode 35, which diffuses and propagates up to the inner wall face of the vacuum chamber 1. When a positive DC voltage from the DC power supply 11 and an RF voltage having a frequency which continuously changes are respectively applied to the inner wall face through the switch 38, an electric field having a frequency which continuously changes is generated at a sheath between the plasma and the inner wall face of the vacuum chamber 1 as in the preceding embodiment. In this way, the foreign particles which have adhered to the inner wall face of the vacuum chamber 1 and the layers which are apt to be stripped off from the inner wall face before becoming foreign particles are separated from the inner wall face, and the foreign particles float in the vicinity of the boundary between the plasma and the sheath. The floating foreign particles are removed by the same means as in the embodiment shown in FIG. 1.

Thereafter, the cleaning gas is discharged from the inside of the vacuum chamber 1, and the operation proceeds to a wafer processing such as an etching or a CVD, thereby making it possible to reduce the influence produced by the foreign particles.

Figure 5:
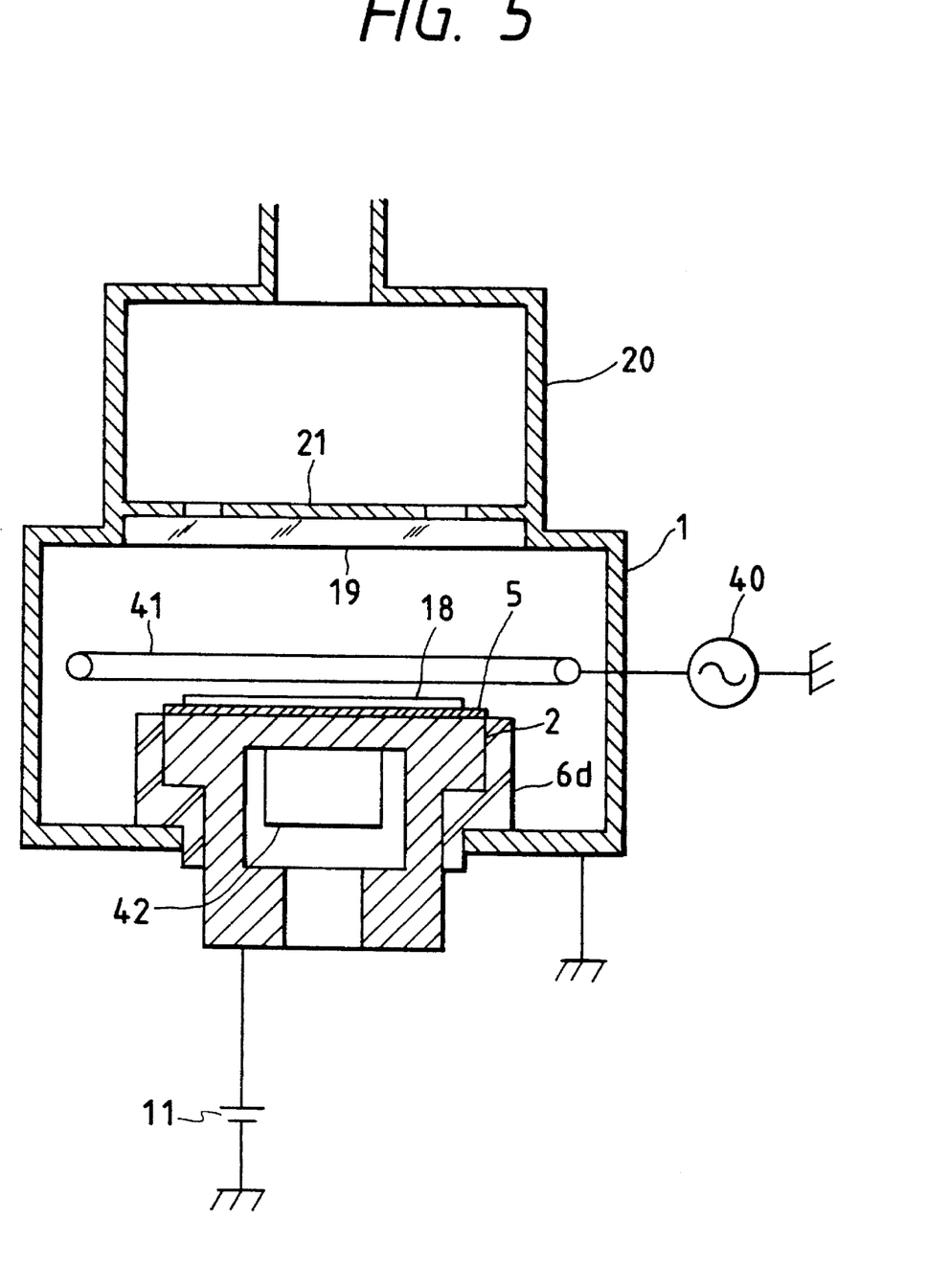
FIG. 5 is a diagram partly in section showing the construction of an apparatus for removing foreign particles in an atmospheric environment and in a dry atmosphere according to the present invention.

FIG. 5 is a diagram showing another embodiment of a method of removing foreign particles and its device according to the present invention. Numeral 40 designates an RF power supply of 13.56 MHz, numeral 41 designates a ring-like electrode, and numeral 42 designates a high-frequency vibration source generating a variable vibration frequency. The elements corresponding to those in FIG. 2 are given the same notation and a duplicate explanation thereof will be omitted.

This embodiment is for avoiding damage to an element formed on the surface of the wafer 18 by ion bombardment etc. during cleaning of the wafer 18. In FIG. 5, the ring-like electrode 41 is installed in surrounding relationship to the stage 2 in the vacuum chamber 1, and the RF power supply 40 is connected thereto. The stage 2 is connected to the high-frequency vibration source 42, which vibrates at a frequency of from 100 kHz to 50 MHz, by which the wafer on the stage 2 can be vibrated.

Next, an explanation will be given of the operation of this embodiment.

After a cleaning gas (ethylene fluoride gas) has been introduced into the vacuum chamber 1, a vacuum state of approximately 1 Pa is maintained, and a microwave is supplied to the cavity resonator 20 from a microwave supply source, not shown, thereby generating a plasma in the vacuum chamber 1. The stage 2 is supplied with a positive DC voltage from the DC power supply 11 and also the wafer 18 on the stage 2 is vibrated by the high-frequency vibration source 42 with a continuously changing frequency.

The surface of the wafer 18 is electrified by the applied DC voltage, and the foreign particles adhering to the surface are simultaneously electrified and receive a force for separating them from the surface of the wafer by an electric field of a plasma potential generated at the sheath between the plasma and the wafer 18. When the wafer 18 is vibrated at a high frequency under this state, the foreign particles on the surface of the wafer 18 receive a separating force which is due to the acceleration produced by the vibration, while also being subjected to a separating force due to the electric field. The vibration of the foreign particles increases by continuously changing the vibration frequency and by matching the frequency with the vibration frequency of each of the adhered foreign particles, and so the foreign particles are separated from the surface of the wafer and are taken into the plasma. At this occasion, the voltage applied to the wafer 18 is only the voltage of the plasma potential, and therefore, there is no damage to the wafer 18 by ion bombardment etc.

Next, a high-frequency wave is supplied to the ring-like electrode 41 from the RF power supply 40 thereby generating a plasma at the surrounding area the ring-like electrode 41, and the supply of the microwave is gradually reduced. Then, the plasma generated on the stage 2 gradually disappears and there is only the ring-like plasma generated at the surrounding area of the ring-like electrode 41. The foreign particles which have been taken in the plasma move along with the plasma, and are enclosed in the plasma at the surrounding area of the ring-like electrode 41. When the supply of the high-frequency power is stopped, the plasma disappears and the foreign particles drop at the surrounding area of the stage 2. At this moment, when the surrounding area of the stage 2 is made an exhaust port, and a cleaning gas is made flow, so that the foreign particles can be discharged more efficiently.

Further, a natural oxide layer on the surface of the wafer 18 or the like is removed by the cleaning gas simultaneously with the foreign particle removing operation. In this way, in this embodiment, the contamination removing operation and the foreign particle removing operation can be performed with a low damage.

Figure 6:
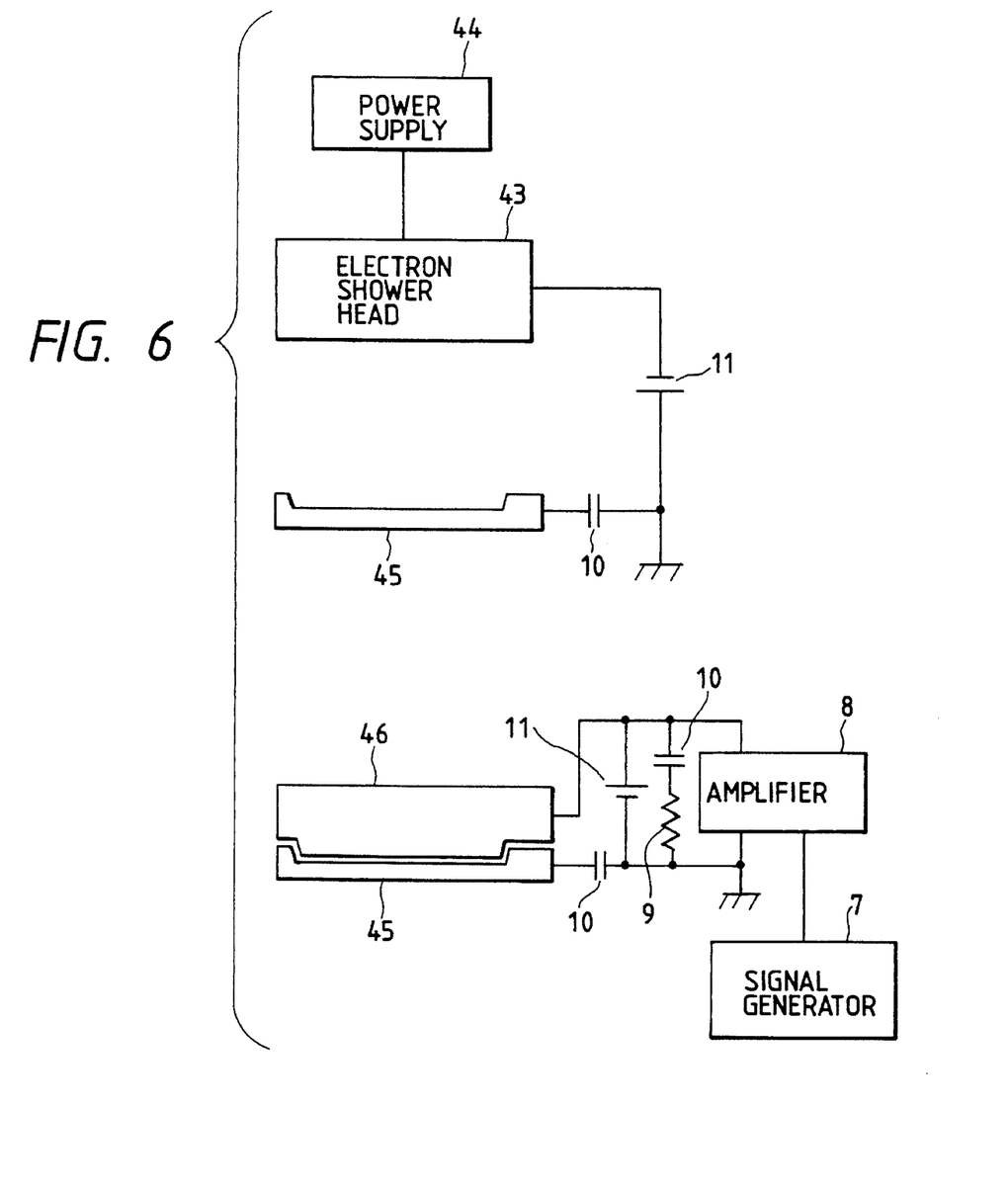
FIG. 6 is a diagram partly in section showing a transfer mechanism that is integrated in a dry process device and the construction of an apparatus for removing foreign particles in a vacuum chamber according to the present invention.

FIG. 6 is a diagram showing another embodiment of a method of removing foreign particles and its apparatus according to the present invention, wherein numeral 43 designates an electron shower head, numeral 44 designates its power supply, numeral 45 designates an arm of a transfer system, and numeral 46 designates a removing electrode. The elements corresponding to those in FIG. 1 are given the same notation and a duplicate explanation thereof will be omitted. Further, the electron shower head 43, the transfer arm 45 and the removing electrode 46 are disposed in a vacuum chamber, not shown, having a vacuum atmosphere of from 0.01 to 1 Pa.

This embodiment is for removing foreign particles at a transfer mechanism which is integrated with a dry process device and is provided in a vacuum chamber. In FIG. 6, the electron shower head 43 and the removing electrode 46 are installed above a position under which the transfer arm 45 moves. The transfer arm 45 is drifting in view of a direct current potential supplied by the capacitor 10. A negative DC voltage is applied to the electron shower 43 from the DC power supply 11, and the removing electrode 46 is supplied with a positive DC voltage from the DC power supply 11, and also with an RF voltage having a frequency which continuously changes from the RF amplifier 8 while performing a matching by the capacitor 10 and the resistor 9.

Next, an explanation will be given of the operation of this embodiment.

The transfer arm 45 is moved under the electron shower head 43, the electron shower head 43 is operated, and at the same time a negative DC voltage of 500 V is applied to the transfer arm 45 from the DC power supply 11 by which the transfer arm 45 is electrified to 500 V. At this moment, the foreign particles adhered to the transfer arm 45 are also electrified. Next, the transfer arm 45 is moved under the foreign particle removing electrode 46, the distance between the removing electrode 46 and the transfer arm 45 being as near as 1 mm, and the removing electrode 46 is supplied with the RF voltage having a frequency which continuously changes as supplied from the RF amplifier 8, and the positive DC voltage from the DC power supply 11. The foreign particles on the surface of the transfer arm 45 are subjected to a force drawing them to the removing electrode 46 and a vibrating force by an electric field which is formed between the removing electrode 46 and the transfer arm 45. By changing the frequency of vibration and matching it with the vibration frequency of each of the adsorbed foreign particles, the vibration of each of the foreign particles increases, and the foreign particles are removed from the transfer arm 45 and are adsorbed by the removing electrode 46. Thereby, the transfer mechanism and the vacuum chamber are cleaned, the adhesion of the foreign particles to a wafer can be reduced and a processing with little influence by the foreign particles can be achieved.

Figure 7:
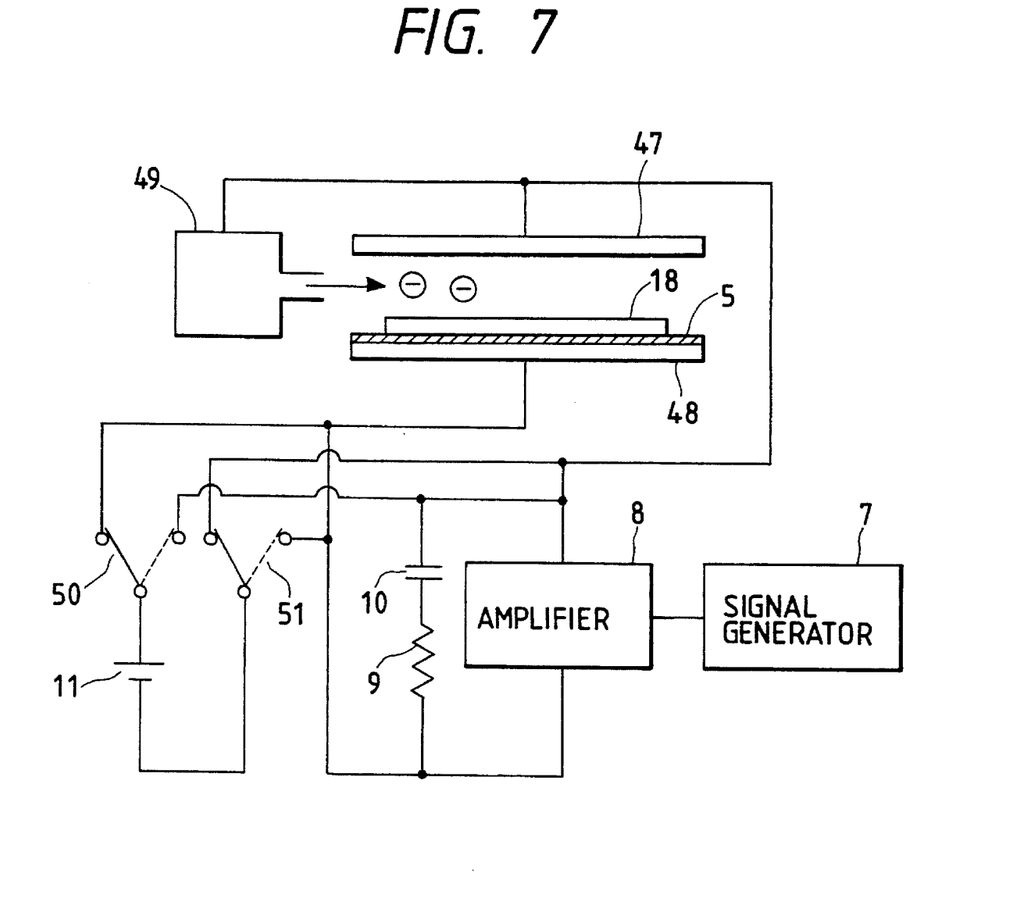
FIG. 7 is a diagram partly in section showing the construction of another embodiment of an apparatus for removing foreign particles according to the present invention.

FIG. 7 is a diagram showing another embodiment of a method of removing foreign particles and its apparatus according to the present invention, wherein numeral 47 designates a counter removing electrode, numeral 48 designates a stage electrode, numeral 49 designates an ion generator, and numerals 50 and 51 designate change-over switches. The elements corresponding to those in FIG. 1 are given the same notation and a duplicate explanation thereof will be omitted. The counter removing electrode 47, the stage electrode 48 and the ion generator 49 are disposed in an oxygen environment under an atmospheric pressure.

This embodiment is for removing foreign particles from a wafer, using a transfer mechanism and the like under an atmospheric pressure environment that does not require a vacuum chamber. In FIG. 7, the insulating layer 5 is coated on the surface of the stage electrode 48, on which the wafer 18 is mounted opposite to the counter electrode 47. The stage electrode 48 and the counter electrode 47 are supplied with a DC voltage from the DC power supply 11 through the change-over switches 50 and 51, and also an RF voltage having a frequency which continuously changes as supplied from the RF amplifier 8, while performing a matching by the capacitor 10 and the resistor 9. Further, ions generated from the ion generator 49 are supplied between both electrodes.

Next, an explanation will be given of the operation of this embodiment.

The wafer 18 is mounted on the stage electrode 48, a negative polarity is connected to the counter electrode 47 and the ion generator 49 by the change-over switches 50 and 51, a positive polarity is connected to the stage electrode 48 and a DC voltage of 500 V is applied thereto. Negative ions are generated from the ion generator 49, by which the surface of the wafer 18 and the foreign particles adhering to the surface are negatively electrified. Next, the positive polarity is connected to the counter electrode 47 by switching the change-over switches 50 and 51, the negative polarity is connected to the stage electrode 48, and a DC voltage of 800 V and an RF voltage having a frequency which continuously changes as supplied from the RF amplifier 8, are applied thereto. Thereby, the foreign particles on the wafer 18 are separated according to the same principle as in the embodiment of FIG. 6, and are adsorbed onto the counter electrode 47. In this way, according to this method, the same effect can be achieved not only in a vacuum, but also under an atmospheric pressure environment.

Another embodiment by this invention will be explained. A wafer is adsorbed to a rotating disk which is rotated at a high speed, whereby a centrifugal force is applied on foreign particles which have adhered to the wafer. Under this state, the rotating disk is vibrated by a vibrator, and further the frequency of vibration is gradually changed. The foreign particles can be separated from the wafer and removed when the vibration frequency of the vibrator is equal to the resonant frequency of each of the foreign particles.

As stated above, according to the present invention, the foreign particles on the wafer can be removed in a dry atmosphere and a vacuum atmosphere. Therefore, the processing, in conjunction with an etching device or a film forming device, is facilitated, and the foreign particles can be removed from the inside of a processing chamber and from portions having a possibility of becoming a foreign particle generating source, by which a processing with little dust generation can be performed.

Figure 8:
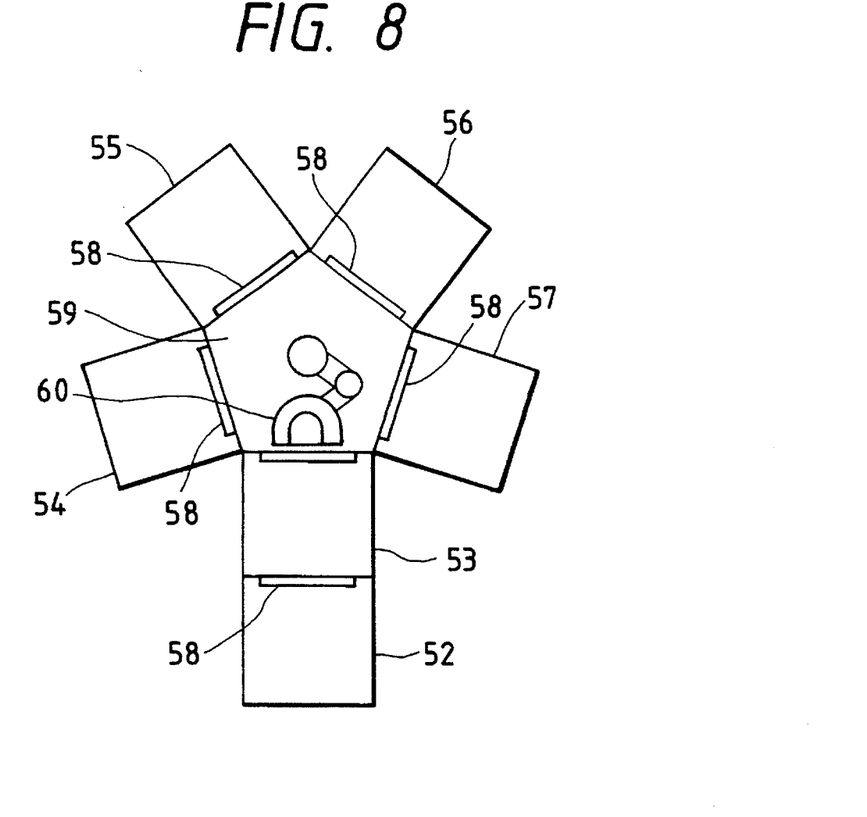
FIG. 8 is a plan view showing a system construction in case wherein this invention is applied to a dry process device system.

FIG. 8 is a diagram showing another embodiment of a method of removing foreign particles and its apparatus according to the present invention, wherein numeral 52 designates a dry cleaning chamber, numeral 53 designates a charge and discharge chamber, numeral 54 designates a foreign particle removing and light etching chamber, numeral 55 designates a CVD deposition chamber, numeral 56 designates an arm cleaning chamber, numeral 57 designates a sputtering deposition chamber, numeral 58 designates gate valves, numeral 59 designates a transfer chamber and numeral 60 designates a transfer robot.

This embodiment relates to a film forming apparatus for achieving a reduction in foreign particles while combining the embodiments explained as above. In FIG. 8, the transfer chamber 59 is disposed at the central position of the apparatus at which center position the transfer robot 60 is installed, the construction can connect the respective processing chambers way of the gate valves 58 and five chambers are provided in the surrounding portion of the transfer chamber 59. The first chamber is the charge and discharge chamber 53 in front of which the dry cleaning chamber 52 having a foreign particle removing means under an atmospheric environment shown in FIG. 7 is provided. The chamber 52 removes foreign particles adhering to the surface of a transferred wafer and foreign particles adhering to the back face thereof, and prevents foreign particles from carrying over to the inside of the apparatus through the wafers. The wafer is transferred to the vacuum transfer chamber 59 by the robot arm 60 through the charge and discharge chamber 53. Next, the wafer is transferred to the foreign particle removing and light etching chamber shown in FIG. 5, wherein the foreign particles on the surface of the wafer are again removed and a contaminated layer on the surface is removed. Thereafter, the wafer is transferred by the transfer robot 60 to the sputtering deposition chamber 57 having a cleaning mechanism shown in FIG. 3, wherein a tungsten layer is sputtered. With respect to the transfer arm of the transfer robot 60, a portion thereof for mounting the wafer is periodically taken into the arm cleaning chamber 56, wherein the foreign particles are removed from the surface so that the foreign particles do not adhere to the transferring wafer. The arm cleaning chamber 56 is provided with the electron shower head 43 and the removing electrode 46, whereby the cleaning is performed by the method as explained in the preceding embodiment. After the tungsten layer has been sputtered, the wafer is transferred to the CVD deposition chamber 55, wherein another tungsten layer is formed by the CVD process. Thereafter, the wafer is taken out from the wafer vacuum chamber through the charge and discharge chamber 53, and the process is completed by removing the foreign particles on the front face and the back face of the wafer in the dry cleaning chamber 52.

As stated above, according to this embodiment, the foreign particles are removed before and after the dry process thereby preventing the generation of defects by the foreign particles and preventing the foreign particles from being carried to a successive step. Further, the control of the foreign particles can certainly be performed by installing an in-line foreign particle inspection device before the dry cleaning chamber 52, and so a further stable production can be performed.

As another embodiment of this invention, the foreign particle removing device under the atmospheric environment shown in FIG. 7 is attached to a wafer stage of an exposure device, by which foreign particles on the surface of the stage and foreign particles on an exposed wafer can be removed.

As explained above, according to the present invention, any foreign particles adhering to a substrate, such as a wafer, that is an object of an etching or a film forming process, so inner wall faces of a processing chamber and, an object in the processing chamber such as a target for film forming, can be removed. The substrate can be rendered in a state without the adherence of foreign particles and a state wherein separated foreign particles do not again adhere thereto, and an etching step or a film forming step can be performed in succession to the foreign particle removing process while the wafer remains as treated by the foreign particle removing process. Even in a processing under an atmospheric environment, as in an exposure step, after foreign particles on the substrate and foreign particles on a surface of an exposure stage have been removed, the exposure step can successively be performed, thereby reducing operational steps, achieving a promotion in product yield in the production of semiconductor devices and promoting the productivity.

As stated above, although an explanation has been given with reference to specific examples of this invention, this invention should not be interpreted as being limited to the above specific examples, and it is clear that the object of this invention can be achieved by changing detailed portions of the above described specific examples without surpassing the scope of the technical thought of this invention, or by changing a combination of the constituent elements of this invention.

What is claimed is:

1. An apparatus for removing foreign particles adhering to a surface of a processed substrate, said apparatus comprising:

separating force applying means for applying a separating force to the foreign particles in a direction of separating the foreign particles from the processed substrate;

means for applying a vibrating force to the foreign particles; and vibration frequency varying means for varying a frequency of the vibrating force.

2. The apparatus for removing foreign particles according to claim 1, wherein the separating force applied to the foreign particles in a direction of separating the foreign particles by the separating force applying means and the vibrating force are electrostatic forces.

3. The apparatus for removing foreign particles according to claim 1, wherein the separating force applied to the foreign particles in a direction of separating the foreign particles by the separating force applying means is a centrifugal force.

4. The apparatus for removing foreign particles according to claim 1, further comprising:

foreign particle discharging means for discharging foreign particles which have been separated from the surface of the processed substrate by the separating force applying means, the vibrating means and the vibration frequency varying means to a region of the processed substrate.

5. An apparatus for removing foreign particles adhering to a surface of a processed substrate in a processing chamber having inside thereof a mounting means for mounting the processed substrate, said apparatus comprising:

plasma generating means for generating a plasma inside of the processing chamber;

direct current voltage applying means for applying a direct current voltage to the mounting means for mounting the processed substrate; and high-frequency voltage applying means for applying a frequency variable high-frequency voltage to the mounting means for mounting the processed substrate.

6. The apparatus for removing foreign particles according to claim 5, wherein the direct current voltage applying means applies a self bias voltage generated by the high-frequency voltage applying means to the mounting means for mounting the processed substrate.

7. The apparatus for removing foreign particles according to claim 5, further comprising:

second direct current applying means for applying a second direct current voltage to a wall face of the processing chamber; and second high-frequency voltage applying means for applying a second frequency variable high-frequency voltage to the wall face of the processing chamber.

8. An apparatus for removing foreign particles adhering to a surface of a processed substrate in a processing chamber having inside thereof a mounting means for mounting the processed substrate, said apparatus comprising:

plasma generating means for generating a plasma inside of the processing chamber; and electrode means having an anode communicating with the plasma inside of the processing chamber and being connected to a direct current power supply for controlling a flowing-in of electrons from the plasma to the anode by the direct current power supply.

9. The apparatus for removing foreign particles according to claim 8, further comprising:

a magnetic field forming portion for forming a magnetic field approximately parallel to a surface of the anode inside of the processing chamber.

10. The apparatus for removing foreign particles according to claim 8, wherein the mounting means is connected to a direct current voltage applying means for applying a direct current voltage to the mounting means and to a high-frequency voltage applying means for applying a frequency variable high-frequency voltage to the mounting means.

11. An apparatus for removing foreign particles adhering to a surface of a processed substrate in a processing chamber having inside thereof a mounting means for mounting the processed substrate, said apparatus comprising:

plasma generating means for generating a plasma inside of the processing chamber;

direct current voltage applying means for applying a direct current voltage to a wall face of the processing chamber; and high-frequency voltage applying means for applying a frequency variable high-frequency voltage to the wall face of the processing chamber.

12. The apparatus for removing foreign particles according to claim 11, further comprising:

electrode means having an anode communicating with the plasma inside of the processing chamber and being connected to a direct current power supply for controlling a flowing-in of electrons from the plasma to the anode by the direct current power supply.

13. The apparatus for removing foreign particles according to claim 12, wherein the electrode means is connected to a second high-frequency voltage applying means for applying a second voltage high-frequency to the wall face of the processing chamber.

14. The apparatus for removing foreign particles according to claim 12, wherein the mounting means is connected to a second direct current voltage applying means for applying a second direct current voltage to the mounting means and to a third high-frequency voltage applying means for applying a third frequency variable high-frequency to the mounting means.

15. An apparatus for removing foreign particles comprising:

electric field generating means for generating an electric field in a region in which there is disposed an object from which foreign particles are to be removed;

electric field varying means for varying the generated electric field;

electric field direction switching means for switching the direction of the generated electric field; and ion supplying means for supplying ions to the region.

16. A method for removing foreign particles adhering to a surface of a processed substrate, said method comprising the steps of:

applying a separating force to the foreign particles in a direction of separating the foreign particles from the processed substrate;

applying a vibrating force to the foreign particles; and varying a frequency of the vibrating force;

whereby foreign particles are removed from the surface of the processed substrate.

17. A method of removing foreign particles according to claim 16, wherein the step of applying a vibrating force and removing foreign particles include:

resonating the foreign particles adhering to the surface of the processed substrate by applying a varying external vibrating force to the foreign particles; and discharging the foreign particles, which have been separated from the processed substrate by said resonating, to outside of a region of the processed substrate, whereby the foreign particles are removed from the processed substrate.

18. The method of removing foreign particles according to claim 17, wherein the foreign particles are resonated by generating a varying external force by applying a direct current voltage and a high-frequency voltage to a mounting means for mounting the processed substrate and by varying a frequency of the high-frequency voltage.

19. A method of removing foreign particles comprising the steps of:

generating a plasma in a vicinity of a surface of a processed substrate disposed in a vacuum vessel;

resonating foreign particles adhering to the surface of the processed substrate by varying an electric field between the plasma and the surface of the processed substrate; and discharging the foreign particles to outside of a region of the processed substrate by drawing the foreign particles, which have been separated from the surface of the processed substrate due to the resonating, to an electrode disposed outside of the region of the processed substrate, whereby the foreign particles are removed.

20. The method of removing foreign particles according to claim 19, wherein the foreign particles adhering to the surface of the processed substrate are resonated by varying an electric field between the plasma and the surface of the processed substrate by applying a direct current voltage and a high-frequency voltage to a mounting means for mounting the processed substrate and varying a frequency of the high-frequency voltage.

21. The method of removing foreign particles according to claim 19, wherein the foreign particles adhering to the surface of the processed substrate are resonated by varying an electric field between the plasma and the surface of the processed substrate by applying a direct current voltage to a mounting means for mounting the processed substrate, applying a high-frequency voltage to a wall face of the vacuum vessel and varying a frequency of the high-frequency voltage.

22. A method of processing comprising the steps of:

removing foreign particles adhering to a surface of a processed substrate in a processing chamber utilizing an apparatus for removing foreign particles including plasma generating means for generating a plasma inside of the processing chamber, and electrode means having an anode communicating with the plasma inside of the processing chamber and being connected to a direct current power supply for controlling a flowing-in of electrons from the plasma to the anode by the direct current power supply; and performing at least one of a film forming process and an etching process after the foreign particles have been removed by the apparatus for removing foreign particles.

23. A method of processing comprising the steps of:

combining a first processing for removing foreign particles on an inner face of a processing chamber and a second processing for removing foreign particles adhering to a substrate utilizing an apparatus for removing foreign particles including plasma generating means for generating a plasma inside of the processing chamber, direct current voltage applying means for applying a direct current voltage to a wall face of the processing chamber, and high-frequency voltage applying means for applying a frequency voltage applying means for applying a frequency variable high-frequency voltage to the wall face of the processing chamber; and a third processing for performing at least one of film forming and etching in the processing chamber of the apparatus for removing foreign particles.

* * * * *